(12) United States Patent
Barnard et al.

(10) Patent No.: US 8,304,085 B2
(45) Date of Patent: *Nov. 6, 2012

(54) METAL FOIL SUBSTRATES COATED WITH CONDENSATION CURED SILICONE RESIN COMPOSITIONS

(75) Inventors: Thomas Duncan Barnard, Murrieta, CA (US); Dimitris Katsoulis, Midland, MI (US); Bizhong Zhu, Midland, MI (US); Maki Itoh, Tokyo (JP)

(73) Assignee: Dow Corning Corporation, Midland, MI (US)

( * ) Notice: Subject to any disclaimer, the term of this patent is extended or adjusted under 35 U.S.C. 154(b) by 423 days.

This patent is subject to a terminal disclaimer.

(21) Appl. No.: 12/297,443

(22) PCT Filed: Apr. 18, 2007

(86) PCT No.: PCT/US2007/009425
§ 371 (c)(1),
(2), (4) Date: Jan. 9, 2009

(87) PCT Pub. No.: WO2007/123926
PCT Pub. Date: Nov. 1, 2007

(65) Prior Publication Data
US 2010/0035046 A1 Feb. 11, 2010

Related U.S. Application Data

(60) Provisional application No. 60/875,995, filed on Dec. 20, 2006.

(51) Int. Cl.
*B32B 9/04* (2006.01)

(52) U.S. Cl. ......... 428/447; 428/325; 428/450; 525/477

(58) Field of Classification Search .................. None
See application file for complete search history.

(56) References Cited

U.S. PATENT DOCUMENTS

| 4,087,585 | A | | 5/1978 | Schulz | |
|---|---|---|---|---|---|
| 4,368,235 | A | * | 1/1983 | Vaughn, Jr. | 428/412 |
| 4,612,409 | A | * | 9/1986 | Hamakawa et al. | 136/244 |
| 4,666,762 | A | * | 5/1987 | Yamamoto | 428/216 |
| 5,194,649 | A | | 3/1993 | Okawa | |
| 5,972,512 | A | * | 10/1999 | Boisvert et al. | 428/409 |
| 6,162,498 | A | | 12/2000 | Mennig et al. | |
| 8,084,532 | B2 | * | 12/2011 | Fisher et al. | 524/496 |
| 2001/0041766 | A1 | | 11/2001 | Wielstra et al. | |
| 2004/0043229 | A1 | * | 3/2004 | Aoki et al. | 428/446 |
| 2004/0247878 | A1 | * | 12/2004 | Imanaka et al. | 428/412 |
| 2006/0182930 | A1 | * | 8/2006 | Kawakami et al. | 428/141 |
| 2007/0111014 | A1 | | 5/2007 | Katsoulis et al. | |
| 2009/0130463 | A1 | * | 5/2009 | Albaugh et al. | 428/447 |

FOREIGN PATENT DOCUMENTS

WO WO 2005017058 A1 * 2/2005

OTHER PUBLICATIONS

Kim, et. al., "Fracture mechanics analysis of coating//substrate systems Part I: Analysis of tensile and bending experiments", Engineering Fracture Mechanics, 2000, pp. 573-593, 65, Pergamon.

* cited by examiner

*Primary Examiner* — Jennifer McNeil
*Assistant Examiner* — Scott R Walshon
(74) *Attorney, Agent, or Firm* — Claude F. Purchase

(57) ABSTRACT

An article of manufacture comprising (i) at least one metal foil substrate; (ii) a coating layer on at least a portion of at least one side of the metal foil substrate wherein the coating layer comprises (a) a condensation cured silicone resin composition and (b) silica nanoparticles.

6 Claims, No Drawings

METAL FOIL SUBSTRATES COATED WITH CONDENSATION CURED SILICONE RESIN COMPOSITIONS

CROSS REFERENCE TO RELATED APPLICATIONS

This application is a U.S. national stage filing under 35 U.S.C. §371 of PCT Application No. filed on PCT/US2007/009425, currently pending, which claims the benefit of U.S. Provisional Patent Application No. 60/875,995 filed Dec. 20, 2006 under 35 U.S.C. §119 (e). PCT Application No. PCT/US2007/009425 and U.S. Provisional Patent Application No. 60/875,995 are hereby incorporated by reference.

BACKGROUND OF THE INVENTION

This invention relates to an article of manufacture comprising (i) at least one metal foil substrate; (ii) a coating layer on at least a portion of at least one side of the metal foil substrate wherein the coating layer comprises (a) a condensation cured silicone resin composition and (b) silica nanoparticles. The unique combination of a condensation curable silicone resin and silica nanoparticles affords very thick crack free coatings, up to 4 micrometer thick, on a substrate such as a stainless steel foil that can sustain a temperature of 700° C. These substrates are useful for Copper Indium Gallium diSelenide (CIGS) solar cells. These substrates can also be used as substrates for thin film batteries.

BRIEF SUMMARY OF THE INVENTION

An article of manufacture comprising (i) at least one metal foil substrate; (ii) a coating layer on at least a portion of at least one side of the metal foil substrate wherein the coating layer comprises (a) a condensation cured silicone resin composition and (b) silica nanoparticles.

DETAILED DESCRIPTION OF THE INVENTION

The metal foil substrate of this invention is typically a sheet of metal with thickness in the range from 0.5 μm to 1000 μm, alternatively from 1 to 500 μm, alternatively from 10 to 200 μm. The materials for the foil can be any metals and their alloys. They can be made by casting, extrusion, rolling, and any other applicable technique. The surface quality can be as cast, as extruded, as rolled, or polished. Polishing can be achieved electrochemically, mechanically, chemical-mechanically, or with any other techniques known in the art. The metal foil can be a roll in physical form without limit in its length, or in the form of cut sheets of a certain size. The metal foil can further comprise a surface layer of composition different from the bulk, for example, a layer of oxide of one of the elements in the bulk composition. S The surface layer can be introduced by thermal oxidation, for example. Its thickness can range from several angstroms to several micrometers. The surface layers can be dense, or porous. Specific examples of metal foil can include but not limited to copper foil, aluminum foil, molybdenum foil, titanium foil, gold foil, silver foil, carbon steel foil, stainless steel foil, nickel foil, zinc foil, or chromium foil.

The coating layer comprises (a) a condensation cured silicone resin composition and (b) silica nanoparticles. The condensation cured silicone resin composition typically comprises a cured product of a silicone composition comprising (A) a condensation curable silicone resin having silicon-bonded hydrogen atoms, silicon bonded hydroxy groups, or silicon-bonded hydrolysable groups and, optionally, (B) a cross-linking agent having silicon-bonded hydrolysable groups and optionally (C) a condensation catalyst. This cured product can be obtained by a method comprising curing a silicone composition comprising (A), optionally (B), and optionally (C). "Cured" as defined herein means the silicone compositions of this invention, which can be in the form of their component parts, a mixture, a solution, or a blend, have been exposed to room temperature air, heated at elevated temperatures, for example, at a temperature of from 50° C. to 450° C., or alternatively at a temperature of from 100° C. to 200° C., or exposed to UV light, electron beam, or microwave. "Curing" as defined herein means exposing to room temperature air, heating at elevated temperatures (for example, at a temperature of from 50° C. to 450° C., or alternatively to a temperature of from 100° C. to 200° C.), or exposing to UV, electron beam, or microwave, the silicone compositions of this invention, which can be in the form of their component parts, a mixture, a solution, or a blend. Heating can occur using any known conventional means such as by placing the silicone composition or the glass coated with the silicone composition into an air circulating oven set at a temperature of from 50° C. to 450° C., or alternatively at a temperature of from 100° C. to 200° C.

The condensation curable silicone resin (A) is typically a copolymer comprising $R^1SiO_{3/2}$ units, i.e., T units, and/or $SiO_{4/2}$ units, i.e., Q units, in combination with $R^1R^2_2SiO_{1/2}$ units, i.e., M units, and/or $R^2_2SiO_{2/2}$ units, i.e., D units, wherein $R^1$ is a $C_1$ to $C_{10}$ hydrocarbyl group or a $C_1$ to $C_{10}$ halogen-substituted hydrocarbyl group, both free of aliphatic unsaturation, $R^2$ is $R^1$, —H, 13 OH, or a hydrolysable group with the proviso that the sum of $R^1SiO_{3/2}$ units and $SiO_{4/2}$ units is greater than zero and contains at least two silicon-bonded hydrogen atoms, at least two silicon-bonded hydroxy groups, or at least two silicon-bonded hydrolysable groups per molecule. For example, the silicone resin can be a DT resin, an MT resin, an MDT resin, a DTQ resin, an MTQ resin, an MDTQ resin, a DQ resin, an MQ resin, or an MDQ resin. As used herein, the term "free of aliphatic unsaturation" means the hydrocarbyl or halogen-substituted hydrocarbyl group does not contain an aliphatic carbon-carbon double bond or carbon-carbon triple bond.

The $C_1$ to $C_{10}$ hydrocarbyl group and $C_1$ to $C_{10}$ halogen-substituted hydrocarbyl group represented by $R^1$ more typically have from 1 to 6 carbon atoms. Acyclic hydrocarbyl and halogen-substituted hydrocarbyl groups containing at least 3 carbon atoms can have a branched or unbranched structure. Examples of hydrocarbyl groups represented by $R^1$ include, but are not limited to, alkyl groups, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, octyl, nonyl, and decyl; cycloalkyl groups, such as cyclopentyl, cyclohexyl, and methylcyclohexyl; aryl groups, such as phenyl and naphthyl; alkaryl groups, such as tolyl and xylyl; and aralkyl groups, such as benzyl and phenethyl. Examples of halogen-substituted hydrocarbyl groups represented by $R^1$ include, but are not limited to, 3,3,3-trifluoropropyl, 3-chloropropyl, chlorophenyl, dichlorophenyl, 2,2,2-trifluoroethyl, 2,2,3,3-tetrafluoropropyl, and 2,2,3,3,4,4,5,5-octafluoropentyl.

According to one embodiment, the condensation curable silicone resin (A) has the formula:

$$(R^1R^2_2SiO_{1/2})_w(R^2_2SiO_{2/2})_x(R^2SiO_{3/2})_y(SiO_{4/2})_z \quad (I)$$

wherein $R^1$ is as defined and exemplified above, $R^2$ is $R^1$, —H, —OH, or a hydrolysable group, and w, x, y, and z are mole fractions, and the silicone resin (A) has an average of at least two silicon-bonded hydrogen atoms, at least two silicon-bonded hydroxy groups, or at least two silicon-bonded hydrolysable groups per molecule. More specifically, the subscript w typically has a value of from 0 to 0.8, alternatively from 0.02 to 0.75, alternatively from 0.05 to 0.3. The subscript x typically has a value of from 0 to 0.6, alternatively from 0 to 0.45, alternatively from 0 to 0.25. The subscript y typically has a value of from 0 to 0.99, S alternatively from 0.25 to 0.8, alternatively from 0.5 to 0.8. The subscript z typically has a value of from 0 to 0.35, alternatively from 0 to 0.25, alternatively from 0 to 0.15. Also, the sum of y+z is greater than zero and is typically from 0.2 to 0.99, alternatively from 0.5 to 0.95, alternatively from 0.65 to 0.9. Further, the sum of w+x can be zero but is typically from 0.01 to 0.80, alternatively from 0.05 to 0.5, alternatively from 0.1 to 0.35.

As used herein the term "hydrolysable group" means the silicon-bonded group reacts with water in the absence of a catalyst at any temperature from room temperature (~23±2° C.) to 100° C. within several minutes, for example thirty minutes, to form a silanol (Si—OH) group. Examples of hydrolysable groups represented by $R^2$ include, but are not limited to, —Cl, —Br, —OR$^3$, —OCH$_2$CH$_2$OR$^3$, CH$_3$C(=O)O—, Et(Me)C=N—O—, CH$_3$C(=O)N(CH$_3$)—, and —ONH$_2$, wherein $R^3$ is $C_1$ to $C_8$ hydrocarbyl or $C_1$ to $C_8$ halogen-substituted hydrocarbyl.

The hydrocarbyl and halogen-substituted hydrocarbyl groups represented by $R^3$ typically have from 1 to 8 carbon atoms, alternatively from 3 to 6 carbon atoms. Acyclic hydrocarbyl and halogen-substituted hydrocarbyl groups containing at least 3 carbon atoms can have a branched or unbranched structure. Examples of hydrocarbyl groups represented by $R^3$ include, but are not limited to, unbranched and branched alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, and octyl; cycloalkyl, such as cyclopentyl, cyclohexyl, and methylcyclohexyl; phenyl; alkaryl, such as tolyl and xylyl; aralkyl, such as benzyl and phenethyl; alkenyl, such as vinyl, allyl, and propenyl; arylalkenyl, such as styryl; and alkynyl, such as ethynyl and propynyl. Examples of halogen-substituted hydrocarbyl groups represented by $R^3$ include, but are not limited to, 3,3,3-trifluoropropyl, 3-chloropropyl, chlorophenyl, and dichlorophenyl.

Typically, 1 mol % to 30 mol %, or alternatively 1 to 15 mol % of the groups $R^2$ in the silicone resin are hydrogen, hydroxy, or a hydrolysable group. As used herein, the mol % of groups in $R^2$ is defined as a ratio of the number of moles of silicon-bonded groups in the condensation curable silicone resin (A) to the total number of moles of the $R^2$ groups in the condensation curable silicone resin (A), multiplied by 100.

Examples of condensation curable silicone resins (A) include, but are not limited to, silicone resins having the following formulae:

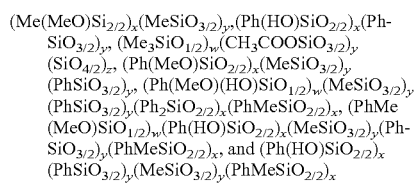

wherein Me is methyl, Ph is phenyl, wherein w, x, y, and z are as defined above, and the subscript y has a value such that the silicone resin has a number-average molecular weight of from 500 to 50,000. The sequence of units in the preceding formulae is not to be viewed in any way as limiting to the scope of the invention.

Specific examples of condensation curable silicone resins (A) include, but are not limited to, silicone resins having the following formulae:

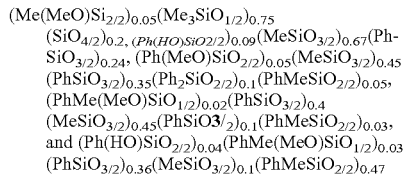

wherein Me is methyl, Ph is phenyl, the numerical subscripts outside the parenthesis denote mole fractions. The sequence of units in the preceding formulae is not to be viewed in any way as limiting to the scope of the invention.

As set forth above, the condensation curable silicone resin (A) represented by formula (I) typically has a number-average molecular weight ($M_n$) of from 500 to 50,000. Alternatively, the condensation curable silicone resin (A) may have a $M_n$ of from 500 to 10,000, alternatively 800 to 3,000, where the molecular weight is determined by gel permeation chromatography employing a refractive index detector and silicone resin (MQ) standards.

The viscosity of the condensation curable silicone resin (A) at 25° C. is typically from 0.01 Pa·s to a solid, alternatively from 0.1 to 10,000 Pa·s, alternatively from 1 to 100 Pa·s. The condensation curable silicone resin (A) represented by formula (V) typically includes less than 10% (w/w), alternatively less than 5% (w/w), alternatively less than 2% (w/w), of silicon-bonded hydroxy groups, as determined by $^{29}$Si NMR.

Methods of preparing condensation curable silicone resins (A) represented by formula (I) are well known in the art; many of these resins are commercially available. Condensation curable silicone resins (A) represented by formula (I) are typically prepared by cohydrolyzing the appropriate mixture of chlorosilane precursors in an organic solvent, such as toluene. For example, a silicone resin including $R^1R^2{}_2SiO_{1/2}$ units and $R^2SiO_{3/2}$ units can be prepared by cohydrolyzing a first compound having the formula $R^1R^2{}_2SiCl$ and a second compound having the formula $R^1SiCl_3$ in toluene, where $R^1$ and $R^2$ are as defined and exemplified above to form aqueous hydrochloric acid and the silicone resin, which is a hydrolyzate of the first and second compounds. The aqueous hydrochloric acid and the silicone resin are separated, the silicone resin is washed with water to remove residual acid, and the silicone resin is heated in the presence of a mild condensation catalyst to "body" the silicone resin to a desired viscosity.

If desired, the silicone resin can be further treated with a condensation catalyst in an organic solvent to reduce the content of silicon-bonded hydroxy groups. Alternatively, first or second compounds containing hydrolysable groups other than chloro, such —Br, —I, —OCH$_3$, —OC(O)CH$_3$, —N(CH$_3$)$_2$, NHCOCH$_3$, and —SCH$_3$, can be co-hydrolyzed to form the silicone resin. The properties of the silicone resin depend on the types of first and second compounds, the mole ratio of first and second compounds, the degree of condensation, and the processing conditions.

In another embodiment, the condensation curable silicone resin (A) can be a rubber-modified silicone resin prepared by reacting an organosilicon compound selected from (i) a silicone resin having the formula $(R^1R^2{}_2SiO_{1/2})_w(R^2{}_2SiO_{2/2})_x(R^1SiO_{3/2})_y(SiO_{4/2})_z$ and (ii) hydrolysable precursors of (i), and (iii) a silicone rubber having the formula $R^4_3SiO(R^1R^4SiO)_mSiR^4_3$ in the presence of water, (iv) a condensation catalyst, and (v) an organic solvent, wherein $R^1$ and $R^2$ are as defined and exemplified above, $R^4$ is $R^1$ or a hydrolysable group, m is from 2 to 1,000, alternatively from 4 to 500, alternatively from 8 to 400, and w, x, y, and z are as defined and exemplified above, and silicone resin (i) has an average of at least two silicon-bonded hydroxy or hydrolysable groups per molecule, the silicone rubber (iii) has an average of at least two silicon-bonded hydrolysable groups per molecule, and the mole ratio of silicon-bonded hydrolysable groups in the silicone rubber (iii) to silicon-bonded hydroxy or hydrolysable groups in the silicone resin (i) is from 0.01 to 1.5, alternatively from 0.05 to 0.8, alternatively from 0.2 to 0.5. Typically, 1 mol % to 30 mol %, or alternatively 1 to 15 mol % of the groups $R^2$ in the silicone resin are hydrogen, hydroxy, or a hydrolysable group.

The silicone resin (i) typically has a number-average molecular weight ($M_n$) of from 500 to 50,000, alternatively from 500 to 10,000, alternatively 800 to 3,000, where the molecular weight is determined by gel permeation chromatography a refractive index detector and silicone resin (MQ) standards.

Specific examples of silicone resins suitable for use as silicone resin (i) include, but are not limited to, resins having the following formulae:

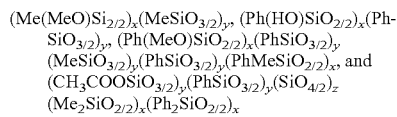

where Me is methyl, Ph is phenyl, where x, y, and z are as defined above, and the subscript y has a value such that the silicone resin has a number-average molecular weight of from 500 to 50,000. The sequence of units in the preceding formulae is not to be viewed in any way as limiting to the scope of the invention.

Specific examples of silicone resins suitable for use as silicone resin (i) include, but are not limited to, resins having the following formulae:

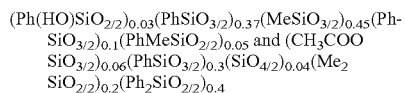

where Me is methyl, Ph is phenyl, the numerical subscripts outside the parenthesis denote mole fractions. The sequence of units in the preceding formulae is not to be viewed in any way as limiting to the scope of the invention. Silicone resin (i) can be a single silicone resin or a mixture comprising two or more different silicone resins, each having the specified formula. Silicone resin (i) can be a single silicone resin or a mixture comprising two or more different silicone resins, each having the specified formula.

As used herein, the term "hydrolysable precursors" refers to silanes having hydrolysable groups that are suitable for use as starting materials (precursors) for preparation of the silicone resin (i). The hydrolysable precursors (ii) can be represented by the formulae $R^1R^4_2SiX$, $R^4_2SiX_2$, $R^4SiX_3$, and $SiX_4$, wherein $R^1$, $R^8$, and X are as defined and exemplified above.

Specific examples of hydrolysable precursors (ii) include, but are not limited to, silanes having the formulae: $Me_3SiCl$, $MeSi(OEt)_3$, $PhSiCl_3$, $MeSiCl_3$, $Me_2SiCl_2$, $PhMeSiCl_2$, $SiCl_4$, $Ph_2SiCl_2$, $PhSi(OMe)_3$, $MeSi(OMe)_3$, $PhMeSi(OMe)_2$, and $Si(OEt)_4$, wherein Me is methyl, Et is ethyl, and Ph is phenyl.

Specific examples of silicone rubbers (iii) include, but are not limited to, silicone rubbers having the following formulae:

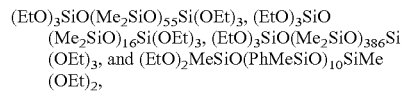

wherein Me is methyl and Et is ethyl.

The reaction is typically carried out at a temperature of from room temperature (~23±2° C.) to 180° C., alternatively from room temperature to 100° C. The reaction time depends on several factors, including the structures of the silicone resin (i) and the silicone rubber (iii), and the temperature. The components are typically allowed to react for a period of time sufficient to complete the condensation reaction. This means the components are allowed to react until at least 40 mol %, alternatively at least 65 mol %, alternatively at least 90 mol %, of the silicon-bonded hydrolysable groups originally present in the silicone rubber (iii) have been consumed in the condensation reaction, as determined by $^{29}Si$ NMR spectrometry. The time of reaction is typically from 1 to 30 h at a temperature of from room temperature (~23±2° C.) to 100° C. The optimum reaction time can be determined by routine experimentation.

Suitable condensation catalysts (iv) are described in further detail below, and suitable organic solvents (v) are described above in the context of the rubber-modified silicone resin above. The concentration of the condensation catalyst (iv) is sufficient to catalyze the condensation reaction of the silicone resin (i) with the silicone rubber (iii). Typically, the concentration of the condensation catalyst (iv) is from 0.01 to 5% (w/w), alternatively from 0.01 to 3% (w/w), alternatively from 0.05 to 2.5% (w/w), based on the weight of the silicon resin (i). The concentration of the organic solvent (v) is typically from 10 to 95% (w/w), alternatively from 20 to 85% (w/w), alternatively from 50 to 80% (w/w), based on the total weight of the reaction mixture.

The concentration of water in the reaction mixture depends on the nature of the groups $R^8$ in the organosilicon compound and the nature of the silicon-bonded hydrolysable groups in the silicone rubber. When the silicone resin (i) contains hydrolysable groups, the concentration of water is sufficient to effect hydrolysis of the hydrolysable groups in the silicon resin (i) and the silicone rubber (iii). For example, the concentration of water is typically from 0.01 to 3 moles, alternatively from 0.05 to 1 moles, per mole of hydrolysable group in the silicone resin (i) and the silicone rubber (iii) combined. When the silicone resin (i) does not contain hydrolysable groups, only a trace amount, e.g., 100 ppm, of water is required in the reaction mixture. Trace amounts of water are normally present in the reactants and/or solvent.

Component (b), the silica nanoparticles can be any silica material having at least one physical dimension (e.g., particle diameter, layer thickness) less than about 200 nm. One particularly useful form of silica nanoparticles are fumed silica nanoparticles. Examples of useful commercially available unmodified silica starting materials include nano-sized colloidal silica's available under the product designations NALCO 1040, 1042, 1050, 1060, 2326, 2327, and 2329 colloidal silica from Nalco Chemical Co., Naperville, Ill., Aerosil® from Degussa, Ludox® from DuPont, Snowtex® from Nissan Chemical, Levasil® from Bayer, or Sylysia® from Fuji Silysia Chemical. Suitable fumed silica's include for example, products commercially available from DeGussa AG, (Hanau, Germany) under the trade designation, "Aerosil series OX 50", as well as product numbers -130, -150, and -200. Fumed silicas are also commercially available from Cabot Corp., Tuscola, I, under the Bade designations CAB O-SPERSE 2095", "CAB-O-SPERSE A105", and "CAB-O-SIL M5". Those skilled in the art are aware of different well-established processes to access particles in different sizes, with different physical properties and with different compositions such as flame-hydrolysis (Aerosil-Process), plasma-process, arc-process and hot-wall reactor-process for gas-phase or solid-phase reactions or ionic-exchange processes and precipitation processes for solution-based reactions.

The silica nanoparticles may be in the form of a colloidal dispersion. The silica nanoparticles thus may be dispersed in a polar solvent such as methanol, ethanol, isopropyl alcohol (IPA), ketones such as methyl isobutyl ketone, water, acetic acid, diols and trials such as propylene glycol, 2-methyl-1,3-propane diol HOCH2CH(CH3)CH2OH, 1,2-hexanediol CH3(CH2)3CH(OH)CH2OH, and glycerol; glycerol esters such as glyceryl triacetate (triacetin), glyceryl tripropionate (tripropionin), and glyceryl tributyrate (tributyrin); and polyglycols such as polyethylene glycols and polypropylene glycols, among which are PPG-14 butyl ether $C_4H_9(OCH(CH_3)CH_2)_{14}OH$.

The silica particle size typically ranges from 1 to 1000 nm, or alternatively from 1 to 100 nm, or alternatively from 5 to 30 nm. The silica nanoparticles can be a single type of silica nanoparticles or a mixture comprising at least two different types of silica nanoparticles. It is known that silica nanoparticles may be of pure silicon dioxide, or they may contain a certain amount of impurities such as $Al_2O_3$, ZnO, and/or cations such as $Na^+$, $K^{++}$, $Ca^{++}$, $Mg^{++}$, etc.

The concentration of the silica nanoparticles is typically from 0.0001 to 99 wt %, alternatively from 0.001 to 75 wt %, alternatively from 10 to 65 wt %, alternatively from 5 to 50 wt %, alternatively from 20 to 40 wt %, based on the total weight of the silicone composition. The silicone composition can be a one-part composition containing the silicone composition comprising the condensation curable silicone resin, and any optional ingredients, and silica nanoparticles in a single part or, alternatively, a multi-part composition comprising these components in two or more parts.

The one-part silicone composition can prepared by combining the condensation curable silicone resin, the silica nanoparticles, and any optional ingredients in the stated proportions at ambient temperature, with or without the aid of an organic solvent. Also, the silicone composition can be prepared by combining the components in each part. The silicone compositions of this invention can also be prepared in-situ, i.e. the silica nanoparticles can be added during the process to manufacture the condensation curable silicone resin described above. Mixing can be accomplished by any of the techniques known in the art such as milling, blending, and stirring, either in a batch or continuous process.

The silicone composition comprising at least one condensation curable silicone resin (A) can further comprise a cross-linking agent (C). The cross-linking agent (C) can have the formula $R^5_qSiX_{4-q}$, wherein $R^5$ is $C_1$ to $C_8$ hydrocarbyl or $C_1$ to $C_8$ halogen-substituted hydrocarbyl, X is a hydrolysable group, and q is 0 or 1. The hydrocarbyl and halogen-substituted hydrocarbyl groups represented by $R^5$, and the hydrolysable groups represented by X are as described and exemplified above.

Specific examples of cross-linking agents (C) include, but are not limited to, alkoxy silanes such as $MeSi(OCH_3)_3$, $CH_3Si(OCH_2CH_3)_3$, $CH_3Si(OCH_2CH_2CH_3)_3$, $CH_3Si[O(CH_2)_3CH_3]_3$, $CH_3CH_2Si(OCH_2CH_3)_3$, $C_6H_5Si(OCH_3)_3$, $C_6H_5CH_2Si(OCH_3)_3$, $C_6H_5Si(OCH_2CH_3)_3$, $CH_2=CHSi(OCH_3)_3$, $CH_2=CHCH_2Si(OCH_3)_3$, $CF_3CH_2CH_2Si(OCH_3)_3$, $CH_3Si(OCH_2CH_2OCH_3)_3$, $CF_3CH_2CH_2Si(OCH_2CH_2OCH_3)_3$, $CH_2=CHSi(OCH_2CH_2OCH_3)_3$, $CH_2=CHCH_2Si(OCH_2CH_2OCH_3)_3$, $C_6H_5Si(OCH_2CH_2OCH_3)_3$, $Si(OCH_3)_4$, $Si(OC_2H_5)_4$, and $Si(OC_3H_7)_4$; organoacetoxysilanes such as $CH_3Si(OCOCH_3)_3$, $CH_3CH_2Si(OCOCH_3)_3$, and $CH_2=CHSi(OCOCH_3)_3$; organoiminooxysilanes such as $CH_3Si[O—N=C(CH_3)CH_2CH_3]_3$, $Si[O—N=C(CH_3)CH_2CH_3]_4$, and $CH_2=CHSi[O—N=C(CH_3)CH_2CH_3]_3$; organoacetamidosilanes such as $CH_3Si[NHC(=O)CH_3]_3$ and $C_6H_5Si[NHC(=O)CH_3]_3$; amino silanes such as $CH_3Si[NH(s-C_4H_9)]_3$ and $CH_3Si(NHC_6H_{11})_3$; and organoaminooxysilanes.

The cross-linking agent (C) can be a single silane or a mixture of two or more different silanes, each as described above. Also, methods of preparing tri- and tetra-functional silanes are well known in the art; many of these silanes are commercially available.

When present, the concentration of the cross-linking agent (C) in the silicone composition is sufficient to cure (cross-link) the condensation-curable silicone resin. The exact amount of the cross-linking agent (C) depends on the desired extent of cure, which generally increases as the ratio of the number of moles of silicon-bonded hydrolysable groups in the cross-linking agent (C) to the number of moles of silicon-bonded hydrogen atoms, hydroxy groups, or hydrolysable groups in the condensation curable silicone resin (A) increases. Typically, the concentration of the cross-linking agent (C) is sufficient to provide from 0.2 to 4 moles of silicon-bonded hydrolysable groups per mole of silicon-bonded hydrogen atoms, hydroxy groups, or hydrolysable groups in the condensation curable silicone resin (A). The optimum amount of the cross-linking agent (C) can be readily determined by routine experimentation.

Condensation catalyst (D) can be any condensation catalyst typically used to promote condensation of silicon-bonded hydroxy (silanol) groups to form Si—O—Si linkages. Examples of condensation catalysts include, but are not limited to, amines; and complexes of lead, tin, zinc, and iron with carboxylic acids. In particular, the condensation catalyst (D) can be selected from tin(II) and tin(IV) compounds such as tin dilaurate, tin dioctoate, and tetrabutyl tin; and titanium compounds such as titanium tetrabutoxide.

When present, the concentration of the condensation catalyst (D) is typically from 0.1 to 10% (w/w), alternatively from 0.5 to 5% (w/w), alternatively from 1 to 3% (w/w), based on the total weight of the condensation curable silicone resin (A).

When the silicone composition includes condensation catalyst (D), the silicone composition is typically a two-part composition where the condensation curable silicone resin (A) and condensation catalyst (D) are in separate parts.

The silicone composition comprising at least one condensation curable silicone resin of this invention can comprise additional ingredients. Examples of additional ingredients include, but are not limited to adhesion promoters, such as the adhesion promoters taught in U.S. Pat. Nos. 4,087,585 and 5,194,649; dyes; pigments; anti-oxidants; heat stabilizers; UV stabilizers; flame retardants; flow control additives; and diluents, such as organic solvents and reactive diluents.

Application of the silicone compositions described above to the metal foil substrate can be any commonly used methods of applying a coating to a solid substrate such as spin coating, knife-coating, flow-coating, spraying, brushing, painting, casting, dip coating, rod coating, blade coating, air knife coating, gravure coating, forward and reverse roll coating, slot and extrusion coating, slide coating and curtain coating.

As cited above the silicone composition can be coated onto the glass substrate before curing or after the silicone composition has been cured.

At least a portion of the metal foil substrate must be coated with the silicone compositions described above, however typically a homogenous blend of the silicone composition is applied to the metal foil substrate such that a uniform layer of the silicone composition is distributed on top of the metal foil substrate and typically all of the available surface of the glass substrate is coated with the silicone composition. It is also contemplated by the present invention that both sides of the metal foil substrate can be coated with the silicone composition(s) described above. The cured silicone resin composition on the metal foil substrate typically has a thickness from 0.010 μm to 20 μm, alternatively from 0.050 μm to 10 μm, alternatively from 0.100 μm to 5 μm.

The coating layer comprising the above described silicone composition can also alternatively be adhered to the metal foil substrate using any conventional adhesives which are useful in bonding coatings to solid substrates.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All percentages are in wt %.

Example 1

Into a 500 mL three necked round bottomed flask equipped with a mechanical stirrer and a thermometer, a chilled mixture of 200 g of colloidal silica in isopropyl alcohol IPA-ST, obtained from Nissan Chemical, and 28 g of de-ionized water was added. The mixture was stirred and further chilled with an ice water bath to 2° C. 70.72 g of methyltrimethoxysilane was added with 3.48 g of acetic acid and hydrolyzed. The mixture was stirred for another three and a half hours. Then the ice water bath was removed and the mixture was allowed to warm up to room temperature. After warming up to room temperature the mixture was stirred for fourteen hours to produce the final resin. The final resin solution was translucent and had a solid content of 24.5 wt.% measured by heating a 1 g sample at 150° C. for an hour. The average composition of the condensation curable silicone resin and silica was $((Me(i-PrO)SiO)_{2/2})_{0.10}(MeSiO_{3/2})^{0.39}(SiO_{4/2})_{0.50})$, where i-PrO denotes an isopropoxy group and $(SiO_{4/2})_{0.50}$ was in the form of core particles in the resin structure and contains a small amount of cations such as Na+.

A roll of 304 type stainless steel foil, 100 micrometers thick and 200 mm wide, the stainless steel foil was produced by Nippon Kinzoku and distributed by Marubeni-Itochu. A 150 mm×200 mm piece was cut from the roll and laid flat on a lab bench top. The resin solution prepared in Example 1) was applied to the top side of the stainless steel foil with a bound wire draw down bar of #18. The coating was air dried by placing the coated stainless steel foil in a fume hood for one hour. Then the coated piece was placed in an oven to cure through the following temperature sequence: 2° C./min. to 150° C., 150° C./1 h., switch off oven to cool. The cured resin coating film on stainless steel foil was smooth and crack free.

Example 2

A same sized piece of stainless steel foil of the same type was coated and cured in the same fashion as described in Example 1 except that a #32 bounded wire draw down bar was used to apply a thicker coating of the resin prepared in Example 1. The cured resin coating film on stainless steel was again smooth and crack free.

Example 3

A same sized piece of stainless steel foil of the same type was coated and cured in the same fashion as described in Example 1 except that a #55 bounded wire draw down bar was used to apply an even thicker coating of the resin prepared in Example 1. The cured resin coating film on stainless steel was again smooth and crack free.

Example 4

A 20 micrometer thick aluminum foil roll was obtained from Pactiv Corporation. Pieces of it were similarly coated and cured. Again smooth and crack free coatings were obtained.

Example 5

A roll of type 430 stainless steel foil, 300 mm wide and 25 micrometers thick, was obtained also from Marubenin-Itochu Steel, Inc. One side of the stainless steel foil was coated with the same resin by a gravure coater with 45 BCM grooves on the roll and cured through a 4 foot long IR furnace set at 300° C. The line speed was 0.5 foot/min. The coating thickness was ~3 micrometers and root mean squared roughness (RMS) of the coating surface was 1.55 nm with a measured area of 25 micrometers by 25 micrometers. The coating was heat treated at 600° C. in $N_2$ without any crack formation.

That which is claimed is:

1. An article of manufacture comprising (i) at least one metal foil substrate having a thickness of 10 to 200 μm; (ii) a coating layer on at least a portion of at least one side of the metal foil substrate wherein the coating layer comprises:

(a) a condensation cured silicone resin composition comprising a cured product of a one-part silicone composition comprising:

(A) a condensation curable silicone resin having the formula:

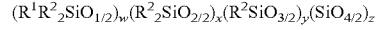
$(R^1R^2_2SiO_{1/2})_w(R^2_2SiO_{2/2})_x(R^2SiO_{3/2})_y(SiO_{4/2})_z$ wherein $R^1$ is a $C_1$ to $C_{10}$ hydrocarbyl group or a $C_1$ to $C_{10}$ halogen-substituted hydrocarbyl group, both free of aliphatic unsaturation, $R^2$ is $R^1$, —H, —OH, or a hydrolysable group, and w has a value of from 0 to 0.8, x has a value of from 0 to 0.6, y has a value of from 0 to 0.99, z has a value of from 0 to 0.35, the sum of y+z is 0.2 to 0.99, and the sum of w+x is zero or 0.01 to 0.80, with the proviso that silicone resin (A) has an average of at least two silicon-bonded hydrogen atoms, or at least two silicon-bonded hydroxy groups, or at least two silicon-bonded hydrolysable groups per molecule;

optionally (B) a cross-linking agent having the formula $R^7_qSiX_{4-q}$, wherein $R^7$ is $C_1$ to $C_8$ hydrocarbyl group or $C_1$ to $C_8$ halogen-substituted hydrocarbyl group, X is a hydrolysable group, and q is 0 or 1; and (C) a condensation catalyst; and (b) silica nanoparticles wherein the one-part silicone composition is prepared by a method comprising adding the silica nanoparticles during the manufacture of the condensation curable silicone resin (A), the method comprising adding a hydrolysable precursor of the condensation curable silicone resin of the formula $(R^1 R^2_2 SiO_{1/2})_w)R^2_2 SiO_{2/2})_x(R^2SiO_{3/2})_y(SiO_{4/2})_z$ with the condensation catalyst (C) to a mixture of water and colloidal dispersion of the silica nanoparticles in a polar solvent to give the one-part silicone composition.

2. An article of manufacture according to claim 1, wherein (A) is a silicone resin having its formula selected from $(Me(MeO)Si_{2/2})_x(MeSiO_{3/2})_y$, $(Ph(HO)SiO_{2/2})_x(PhSiO_{3/2})_y$, $(Me_3SiO_{1/2})_w(CH_3COOSiO_{3/2})_y(SiO_{4/2})_z$, $(Ph(MeO)SiO_{2/2})_x(MeSiO_{3/2})_y(PhSiO_{3/2})_y$, $(Ph(MeO)(HO)SiO_{1/2})_w(MeSiO_{3/2})_y(PhSiO_{3/2})_y(Ph_2SiO_{2/2})_x$ $(PhMeSiO_{2/2})_x$, $(PhMe(MeO)SiO_{1/2})_w(Ph(HO)SiO_{2/2})_x$ $(MeSiO_{3/2})_y(PhSiO_{3/2})_y(PhMeSiO_{2/2})_x$, or $(Ph(HO)SiO_{2/2})_x(PhSiO_{3/2})_y(MeSiO_{3/2})_y(PhMeSiO_{2/2})_x$ wherein Me is methyl, Ph is phenyl, wherein w, x, y, and z are as defined above, and the subscript y has a value such that the silicone resin has a number-average molecular weight of from 500 to 50,000; and (B) is selected from $MeSi(OCH_3)_3$, $CH_3Si(OCH_2CH_3)_3$, $CH_3Si(OCH_2CH_2CH_3)_3$, $CH_3Si[O(CH_2)_3CH_3]_3$, $CH_3CH_2SiOCH_2CH_3)_3$, $C_6H_5Si(OCH_3)_3$, $C_6H_5CH_2Si(OCH_3)_3$, $C_6H_5Si(OCH_2CH_3)_3$, $CH_2=CHSi(OCH_3)_3$, $CH_2=CHCH_2Si(OCH_3)_3$, $CF_3CH_2CH_2Si(OCH_3)_3$, $CH_3Si(OCH_2CH_2OCH_3)_3$, $CF_3CH_2CH_2Si(OCH_2CH_2OCH_3)_3$, $CH_2=CHSi(OCH_2CH_2OCH_3)_3$, $CH_2=CHCH_2Si(OCH_2CH_2OCH_3)_3$, $C_6H_5Si(OCH_2CH_2OCH_3)_3$, $Si(OCH_3)_4$, $Si(OC_2H_5)_4$, $Si(OC_3H_7)_4$, $Si(OC_3H_7)_4$, $CH_3Si(OCOCH_3)_3$, $CH_3CH_2Si(OCOCH_3)_3$, $CH_2=CHSi(OCOCH_3)_3$, $CH_3Si[O-N=C(CH_3)CH_2CH_3]_3$, $Si[O-N=C(CH_3)CH_2CH_3]_4$, $CH_2=CHSi[O-N=C(CH_3)CH_2CH_3]_3$, $CH_3Si[NHC(=O)CH_3]_3$, $C_6H_5Si[NHC(=O)CH_3]_3$, $CH_3Si[NH(s-C_4H_9)]_3$ or $CH_3Si(NHC_6H_{11})_3$.

3. An article of manufacture according to claim 1, wherein $R^1$ is methyl, w is zero, x is zero, and z has a value from 0 to 0.15.

4. An article of manufacture comprising (i) at least one metal foil substrate; (ii) a coating layer on at least a portion of at least one side of the metal foil substrate wherein the coating layer comprises a condensation curable silicone resin having an average composition of $((Me(i-PrO)SiO_{2/2})_{0.10}(MeSiO_{3/2})_{0.39}(SiO_{4/2})_{0.50})$ where i-PrO denotes an isopropoxy group and $(SiO_{4/2})_{0.50}$ is in the form of core particles in the resin structure, wherein the condensation curable silicone resin having the average composition of $((Me(i-PrO)SiO_{2/2})_{0.10}(MeSiO_{3/2})_{0.39}(SiO_{4/2})_{0.50})$ is a one-part silicon composition that is prepared by a method comprising adding methyltrimethoxysilane with acetic acid to a mixture of water and a colloidal dispersion of the silica nanoparticles in isopropyl alcohol to give the one-part silicone composition of the condensation curable silicone resin having the average composition of $((Me(i-PrO)SiO_{2/2})_{0.10}(MeSiO_{3/2})_{0.39}(SiO_{4/2})_{0.50})$.

5. An article of manufacture comprising (i) at least one metal foil substrate having a thickness of 10 to 200 μm; (ii) a coating layer on at least a portion of at least one side of the metal foil substrate wherein the coating layer comprises: a condensation cured silicone resin composition comprising a cured product of a one-part silicone composition that is a condensation curable silicone resin having an average composition of $((Me(i-PrO)SiO_{2/2})_{0.10}(MeSiO_{3/2})_{0.39}(SiO_{4/2})_{0.50})$ where i-PrO denotes an isopropoxy group and $(SiO_{4/2})_{0.50}$ is in the form of core particles in the resin structure, wherein the condensation curable silicone resin having the average composition of $((Me(i-PrO)SiO_{2/2})_{0.10}(MeSiO_{3/2})_{0.39}(SiO_{4/2})_{0.50})$ is prepared by a method comprising adding methyltrimethoxysilane with acetic acid to a mixture of water and a colloidal dispersion of the silica nanoparticles in isopropyl alcohol to give the one-part silicone composition of the condensation curable silicone resin having the average composition of $((Me(i-PrO)SiO_{2/2})_{0.10}(MeSiO_{3/2})_{0.39}(SiO_{4/2})_{0.50})$.

6. An article of manufacture of claim 5, wherein the coating layer is characterizable as being crack free after heat treating the coating layer at 600 degrees Celsius in $N_2$ for 1 hour.

\* \* \* \* \*